United States Patent
Lastra

(10) Patent No.: US 11,282,240 B2
(45) Date of Patent: Mar. 22, 2022

(54) GENERATION AND IMPLEMENTATION OF MULTI-LAYER ENCODED DATA IMAGES

(71) Applicant: Saudi Arabian Oil Company, Dhahran (SA)

(72) Inventor: Rafael Adolfo Lastra, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 157 days.

(21) Appl. No.: 16/856,857

(22) Filed: Apr. 23, 2020

(65) Prior Publication Data

US 2021/0335020 A1 Oct. 28, 2021

(51) Int. Cl.
*E21B 47/002* (2012.01)
*G06T 11/20* (2006.01)
(Continued)

(52) U.S. Cl.
CPC ............ *G06T 11/00* (2013.01); *E21B 43/128* (2013.01); *E21B 47/002* (2020.05); *E21B 47/0025* (2020.05); *G06F 16/54* (2019.01); *G06F 30/27* (2020.01); *G06T 11/206* (2013.01); *E21B 2200/20* (2020.05); *F04B 49/065* (2013.01)

(58) Field of Classification Search
CPC .... E21B 47/0025; G06T 11/206; G06T 11/00; G06F 16/54
See application file for complete search history.

(56) References Cited

U.S. PATENT DOCUMENTS

| 10,417,554 B2 | 9/2019 | Scheffler |
| 10,460,431 B2 | 10/2019 | Bertuccelli et al. |

(Continued)

FOREIGN PATENT DOCUMENTS

| CN | 110109015 A | 8/2019 |
| WO | 2016004774 A1 | 1/2016 |

(Continued)

OTHER PUBLICATIONS

International Search Report and Written Opinion for International Application No. PCT/US2021/028937, report dated Jul. 29, 2021; pp. 1-22.

(Continued)

*Primary Examiner* — Giovanna Wright
(74) *Attorney, Agent, or Firm* — Bracewell LLP; Constance G. Rhebergen; Christopher L. Drymalla

(57) ABSTRACT

Provided are embodiments for obtaining time series datasets, determining resolution and section layout for a multi-layer encoded data image, determining, based on the image resolution and the section layout, a section resolution, generating image section arrays for the datasets that includes scaling the time series datasets to the section resolution to generate scaled time series datasets, generating an image section array for the time series datasets that include a first pixel value at points in the image section array corresponding to a data point of the scaled time series dataset and a second pixel value at points in the image section array that do not correspond to a data point of the scaled time series dataset, and generating, based on the image section arrays, the multi-layer encoded data image where each image section array is populated into a respective section of a respective layer of the image.

29 Claims, 7 Drawing Sheets

(51) Int. Cl.
    *G06T 11/00*     (2006.01)
    *G06F 16/54*     (2019.01)
    *G06F 30/27*     (2020.01)
    *E21B 43/12*     (2006.01)
    *F04B 49/06*     (2006.01)

(56) References Cited

U.S. PATENT DOCUMENTS

2019/0108618 A1     4/2019   Hwang et al.
2019/0130669 A1*  5/2019   Boggio ................ G05B 23/024

FOREIGN PATENT DOCUMENTS

| WO | 2016194311 A1 | 8/2016 |
| WO | 2018165352 A1 | 9/2018 |
| WO | 2019222129 A1 | 11/2019 |

OTHER PUBLICATIONS

Hur, Taeho et al.; "Iss2Image: A Novel Signal-Encoding Technique for CNN-Based Human Activity Recognition" Sensors 2018, 18, 3910; pp. 1-19.
Wikipedia; "RGB color model" available as of Apr. 23, 2020 at: https://en.wikipedia.org/wiki/RGB_color_model; pp. 1-13.
Wikipedia; "Time series" available as of Apr. 3, 2020 at: https://en.wikipedia.org/wiki/Time_series; pp. 1-13.

* cited by examiner

GENERATION AND IMPLEMENTATION OF MULTI-LAYER ENCODED DATA IMAGES

FIELD

Embodiments relate generally to generation and use of multi-layer images, and more particularly to multi-layer images incorporating encoded time series data.

BACKGROUND

A time series is a series of data points indexed (or listed or graphed) in time order. This may include a sequence taken at successive equally spaced points in time. For example, in the context of a hydrocarbon wells (e.g., oil and gas wells), a set of time series data (or a "time series dataset" or "time series data stream") may include, for example, a series of consecutive measurements acquired by way of a sensor that monitor an aspect of the operation of the well. This may include, for example, a series of electrical current measurements of power supplied to a downhole electric submersible pump (ESP), acquired at one second intervals from a corresponding current sensor.

In many instances, time series data is used to identify past events or to predict future events. This can include time series analysis (e.g., analyzing time series data to extract meaningful statistics and other characteristics of the data) or time series forecasting (e.g., analyzing time series data to predict future values based on the data). For example, in the context of a hydrocarbon well, time series datasets from various sensors can be used to determine operating conditions for piece of equipment used to operate the well. This may include, for example, using a series of electrical current measurements for power supplied to an ESP to determine past operational characteristics of the ESP or to predict a future operating condition of the ESP, such as an anticipated time of failure based on trends in the ESP's electrical current draw or other conditions.

SUMMARY

Time series analysis and forecasting can be useful techniques for understanding and employing time series data. For example, in the context of a hydrocarbon well, a well operator may assess time series data acquired from various sensors to monitor current operation conditions, to determine the effects of past operational changes, or to predict future operating conditions, and may identify an employ well operating parameters based on the assessment. In some instances, past (or "historical") time series data is assessed to generate models that are used to predict future operating conditions. These models may, for example, identify events that correspond to trends in the time series data. In an effort to enhance accuracy, models are typically developed (or "trained") using a relatively large set of historical data. This may enable the model to take into account relatively large variations in trends and associated events, which can, in turn, generate a model that can more accurately predict events. In some instances, providing a dataset for training of a model can be difficult. For example, as a historical dataset grows in size, the storage and processing overhead can increase significantly. In some instances, training datasets are so large that they simply exceed the storage capacity of the processing system or require a large amount processing resources to manage.

Although there are numerous existing techniques for time series analysis and forecasting, many suffer from shortcomings that can make them impractical or unreliable. For example, in some instances, time series data is represented in graphical images that can be visually assessed to determine historical characteristics or models. In the context of an electric submersible pump (ESP), for example, a historical set of time series data for a series of electrical current measurements for power supplied to the ESP, pressure or temperature data from downhole sensors, or the like may be stored as an image (e.g., 244 pixels wide×244 pixels in height) that includes a plot of signal measurements versus time. The image may, in turn, be assessed by a computer vision processing application that visually inspects the image and employs machine learning to generate a model based on the data. Although this imaging technique may be suitable for a relatively small set of training data, this may not work well for relatively large sets of training data. For example, fitting of a large dataset into an image of a given resolution (e.g., a given width and height in pixels) may result in a relatively low resolution representation of the data in which the exact data values and trends are less visible, or not visible at all. One possible solution is to increase the size (or "resolution") of the image in which the data is stored (e.g., increase the image width or height). Unfortunately, this can significantly increase the storage requirements and processing overhead. Moreover, a computer vision processing application may be designed for use with a given image resolution, which can inhibit the ability to simply increase image resolution.

Provided are embodiments for generation and use of multi-layer encoded data images. Embodiments may provide for encoding time series data into an image in a manner that provides relatively high resolution (or "detail") while maintaining image resolution. This may be useful, for example, for developing computer vision based machine learning without significant modification to existing image resolution requirements or detection techniques. In some embodiments, each of multiple time series datasets is encoded into a respective one of the layers of a multi-layer image, such as an RGB image which has a red, a green and a blue layer. For example, in the case of a RGB image having a resolution of 244 pixels×244 pixels, each of three datasets may be scaled to a resolution of 244 pixels×244 pixels and be stored in a respective one of the three layers (e.g., in the R-layer, the G-layer, or the B-layer) of the RGB image. This may enable each of the datasets to maintain a 244×244 resolution, as opposed to a 244×81 resolution that may be realized if each of the three rows were fit into an individual section (e.g., one of three rows) within the image.

Provided in some embodiments is a method of operating a hydrocarbon well that includes the following: obtaining a historical dataset for a hydrocarbon well, the historical dataset including time series datasets where each time series dataset of the time series datasets includes, for each point in time of points in time across a time interval of the time series dataset, a characteristic value; determining an image resolution of a multi-layer encoded data image, where the multi-layer encoded data image includes an RGB image and the image resolution includes an image width ($W_i$) of the multi-layer encoded data image and an image height ($H_i$) of the multi-layer encoded data image; determining a section layout for the multi-layer encoded data image that includes: a number of rows (N) to be provided in the multi-layer encoded data image; and a number of columns (C) to be provided in the multi-layer encoded data image; determining, based on the image resolution and the section layout, a section resolution that includes a section width ($W_s$) width corresponding to the image width ($W_i$) divided by the number of columns (C); and a section height ($H_s$) corresponding to the image height ($H_i$) divided by the number of rows (N); generating image section arrays for the historical dataset that includes, for each time series dataset of the time series datasets: scaling the time series dataset to the section resolution to generate a scaled time series dataset for the time series dataset, where the scaling of the time series dataset to the section resolution includes: scaling the values of the points in time of the time series dataset across a range of zero to the section width ($W_s$); and scaling the values of the characteristic values of the time series dataset across a range of zero to the section height ($H_s$); generating an image section array for the time series dataset that includes a first pixel value at each point in the image section array corresponding to a data point of the scaled time series dataset and a second pixel value at each point in the image section array that does not correspond to a data point of the scaled time series dataset; generating, based on the image section arrays for the historical dataset, the multi-layer encoded data image including: a first layer defined by a first array of data that incorporates one or more of the image section arrays (the first layer being a red layer of the RGB image); a second layer defined by a second array of data that incorporates one or more of the image section arrays (the second layer being a green layer of the RGB image); and a third layer defined by a second array of data that incorporates one or more of the image section arrays (the third layer being a blue layer of the RGB image), where each image section array of the image section arrays is populated into a respective section of a respective one of the first layer, the second layer or the third layer; assessing the multi-layer encoded data image to determine an event associated with the historical dataset; determining, based on the event, a well operating parameter; and operating the hydrocarbon well in accordance with the well operating parameter.

In some embodiments, the first pixel value includes a maximum pixel value, and where the second pixel value includes a minimum pixel value. In certain embodiments, the first pixel value is 255, and the second pixel value is 0. In some embodiments, a total number of section (S) is defined by the number of rows (N) multiplied by the number of columns (C) multiplied by three, and the number of rows (N) and the number of columns (C) are determined such that the total number of sections (S) is greater than or equal to a number time series datasets (D) in the historical dataset (HD). In some embodiments, the assessing the multi-layer encoded data image to determine an event associated with the historical dataset includes: generating a model based on the multi-layer encoded data; and determining the event based on the model.

Provided in some embodiments is a method of generating a multi-layer encoded data image that includes: obtaining a historical dataset including time series datasets where each time series dataset of the time series datasets including, for each point in time of points in time across a time interval of the time series dataset, a characteristic value; determining an image resolution of a multi-layer encoded data image that includes an image width ($W_i$) of the multi-layer encoded data image and an image height ($H_i$) of the multi-layer encoded data image; determining a section layout for the multi-layer encoded data image that includes a number of rows (N) to be provided in the multi-layer encoded data image and a number of columns (C) to be provided in the multi-layer encoded data image; determining, based on the image resolution and the section layout, a section resolution that includes a section width ($W_s$) width corresponding to the image width ($W_i$) divided by the number of columns (C) and a section height ($H_s$) corresponding to the image height ($H_i$) divided by the number of rows (N); generating image section arrays for the historical dataset including, for each time series dataset of the time series datasets: scaling the time series dataset to the section resolution to generate a scaled time series dataset for the time series dataset where the scaling of the time series dataset to the section resolution includes: scaling the values of the points in time of the time series dataset across a range of zero to the section width ($W_s$); and scaling the values of the characteristic values of the time series dataset across a range of zero to the section height ($H_s$); generating an image section array for the time series dataset that includes a first pixel value at each point in the image section array corresponding to a data point of the scaled time series dataset and a second pixel value at each point in the image section array that does not correspond to a data point of the scaled time series dataset; and generating, based on the image section arrays for the historical dataset, the multi-layer encoded data image that including: a first layer defined by a first array of data that incorporates one or more of the image section arrays; a second layer defined by a second array of data that incorporates one or more of the image section arrays; and a third layer defined by a second array of data that incorporates one or more of the image section arrays, where each image section array of the image section arrays is populated into a respective section of a respective one of the first layer, the second layer or the third layer.

In some embodiments, the multi-layer encoded data image includes a RGB image, the first layer is a red layer of the RGB image, the second layer is a green layer of the RGB image, and the third layer is a blue layer of the RGB image. In certain embodiments, the first pixel value includes a maximum pixel value, and the second pixel value includes a minimum pixel value. In some embodiments, the first pixel value is 255, and the second pixel value is 0. In certain embodiments, a total number of section (S) is defined by the number of rows (N) multiplied by the number of columns (C) multiplied by three, and the number of rows (N) and the number of columns (C) are determined such that the total number of sections (S) is greater than or equal to a number time series datasets (D) in the historical dataset (HD). In some embodiments, the assessing the multi-layer encoded data image to determine an event associated with the historical dataset includes: generating a model based on the multi-layer encoded data; and determining the event based on the model. In certain embodiments, the historical dataset includes a historical dataset for a hydrocarbon well, and the method further includes: conducting an assessment of the multi-layer encoded data image to determine an event associated with the historical dataset; determining, based on the event, a well operating parameter; and operating the hydrocarbon well in accordance with the well operating parameter. In some embodiments, the event includes a condition associated with an electronic submersible pump (ESP) disposed in wellbore of the hydrocarbon well, the well operating parameter includes a pump operating parameter for the ESP, and operating the hydrocarbon well in accordance with the well operating parameter includes operating the ESP in accordance with the pump operating parameter.

Provided in some embodiments is system for generating a multi-layer encoded data image that includes: a processor; and non-transitory computer readable storage medium including program instructions stored thereon that are executable by the processor to perform the following operations: obtaining a historical dataset including time series datasets where each time series dataset of the time series datasets includes, for each point in time of points in time across a time interval of the time series dataset, a characteristic value; determining an image resolution of a multi-layer encoded data image that includes an image width ($W_i$) of the multi-layer encoded data image and an image height ($H_i$) of the multi-layer encoded data image; determining a section layout for the multi-layer encoded data image that includes a number of rows (N) to be provided in the multi-layer encoded data image and a number of columns (C) to be provided in the multi-layer encoded data image; determining, based on the image resolution and the section layout, a section resolution that includes a section width ($W_s$) width corresponding to the image width ($W_i$) divided by the number of columns (C) and a section height ($H_s$) corresponding to the image height ($H_i$) divided by the number of rows (N); generating image section arrays for the historical dataset including, for each time series dataset of the time series datasets: scaling the time series dataset to the section resolution to generate a scaled time series dataset for the time series dataset where the scaling of the time series dataset to the section resolution includes: scaling the values of the points in time of the time series dataset across a range of zero to the section width ($W_s$); and scaling the values of the characteristic values of the time series dataset across a range of zero to the section height ($H_s$); generating an image section array for the time series dataset that includes a first pixel value at each point in the image section array corresponding to a data point of the scaled time series dataset and a second pixel value at each point in the image section array that does not correspond to a data point of the scaled time series dataset; and generating, based on the image section arrays for the historical dataset, the multi-layer encoded data image including: a first layer defined by a first array of data that incorporates one or more of the image section arrays; a second layer defined by a second array of data that incorporates one or more of the image section arrays; and a third layer defined by a second array of data that incorporates one or more of the image section arrays, where each image section array of the image section arrays is populated into a respective section of a respective one of the first layer, the second layer or the third layer.

In some embodiments, the multi-layer encoded data image includes a RGB image, the first layer is a red layer of the RGB image, the second layer is a green layer of the RGB image, and the third layer is a blue layer of the RGB image. In certain embodiments, the first pixel value includes a maximum pixel value and the second pixel value includes a minimum pixel value. In some embodiments, the first pixel value is 255 and the second pixel value is 0. In certain embodiments, a total number of section (S) is defined by the number of rows (N) multiplied by the number of columns (C) multiplied by three, and the number of rows (N) and the number of columns (C) are determined such that the total number of sections (S) is greater than or equal to a number time series datasets (D) in the historical dataset (HD). In some embodiments, the assessing the multi-layer encoded data image to determine an event associated with the historical dataset includes: generating a model based on the multi-layer encoded data; and determining the event based on the model. In certain embodiments, the historical dataset includes a historical dataset for a hydrocarbon well, and the operations further include: conducting an assessment of the multi-layer encoded data image to determine an event associated with the historical dataset; determine, based on the event, a well operating parameter; and operating the hydrocarbon well in accordance with the well operating parameter. In some embodiments, the event includes a condition associated with an electronic submersible pump (ESP) disposed in wellbore of the hydrocarbon well, the well operating parameter includes a pump operating parameter for the ESP, and operating the hydrocarbon well in accordance with the well operating parameter includes operating the ESP in accordance with the pump operating parameter.

Provided in some embodiments is a non-transitory computer readable storage medium including program instructions stored thereon that are executable by a processor to perform the following operations for generating a multi-layer encoded data image: obtaining a historical dataset including time series datasets where each time series dataset of the time series datasets including, for each point in time of points in time across a time interval of the time series dataset, a characteristic value; determining an image resolution of a multi-layer encoded data image that includes an image width ($W_i$) of the multi-layer encoded data image and an image height ($H_i$) of the multi-layer encoded data image; determining a section layout for the multi-layer encoded data image that includes a number of rows (N) to be provided in the multi-layer encoded data image and a number of columns (C) to be provided in the multi-layer encoded data image; determining, based on the image resolution and the section layout, a section resolution that includes a section width ($W_s$) width corresponding to the image width ($W_i$) divided by the number of columns (C); and a section height ($H_s$) corresponding to the image height ($H_i$) divided by the number of rows (N); generating image section arrays for the historical dataset including, for each time series dataset of the time series datasets: scaling the time series dataset to the section resolution to generate a scaled time series dataset for the time series dataset where the scaling of the time series dataset to the section resolution includes: scaling the values of the points in time of the time series dataset across a range of zero to the section width ($W_s$) and scaling the values of the characteristic values of the time series dataset across a range of zero to the section height ($H_s$); generating an image section array for the time series dataset that includes a first pixel value at each point in the image section array corresponding to a data point of the scaled time series dataset and a second pixel value at each point in the image section array that does not correspond to a data point of the scaled time series dataset; and generating, based on the image section arrays for the historical dataset, the multi-layer encoded data image including: a first layer defined by a first array of data that incorporates one or more of the image section arrays; a second layer defined by a second array of data that incorporates one or more of the image section arrays; and a third layer defined by a second array of data that incorporates one or more of the image section arrays, where each image section array of the image section arrays is populated into a respective section of a respective one of the first layer, the second layer or the third layer.

In some embodiments, where the multi-layer encoded data image includes a RGB image, the first layer is a red layer of the RGB image, the second layer is a green layer of the RGB image, and the third layer is a blue layer of the RGB image. In certain embodiments, the first pixel value includes a maximum pixel value and the second pixel value includes a minimum pixel value. In some embodiments, the first pixel value is 255 and the second pixel value is 0. In certain embodiments, a total number of section (S) is defined by the number of rows (N) multiplied by the number of columns (C) multiplied by three, and the number of rows (N) and the number of columns (C) are determined such that the total number of sections (S) is greater than or equal to a number time series datasets (D) in the historical dataset (HD). In some embodiments, the assessing the multi-layer encoded data image to determine an event associated with the historical dataset includes: generating a model based on the multi-layer encoded data; and determining the event based on the model. In certain embodiments, the historical dataset includes a historical dataset for a hydrocarbon well and the operations further include: conducting an assessment of the multi-layer encoded data image to determine an event associated with the historical dataset; determining, based on the event, a well operating parameter; and operating the hydrocarbon well in accordance with the well operating parameter. In some embodiments, the event includes a condition associated with an electronic submersible pump (ESP) disposed in wellbore of the hydrocarbon well, the well operating parameter includes a pump operating parameter for the ESP, and operating the hydrocarbon well in accordance with the well operating parameter includes operating the ESP in accordance with the pump operating parameter.

Figure 1:
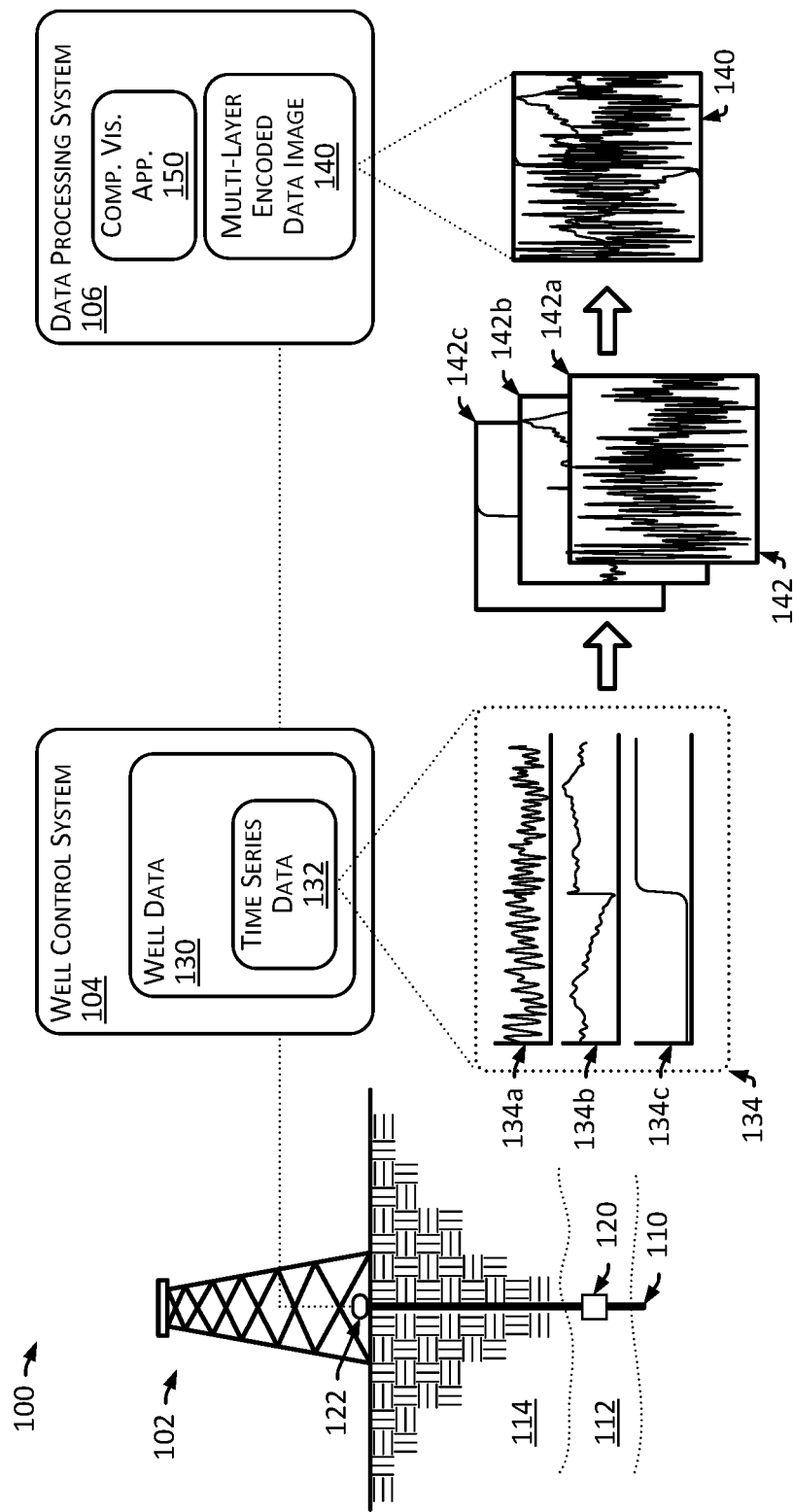
FIG. 1 is diagram that illustrates a hydrocarbon well environment in accordance with one or more embodiments.

While this disclosure is susceptible to various modifications and alternative forms, specific embodiments are shown by way of example in the drawings and will be described in detail. The drawings may not be to scale. It should be understood that the drawings and the detailed descriptions are not intended to limit the disclosure to the particular form disclosed, but are intended to disclose modifications, equivalents, and alternatives falling within the scope of the present disclosure as defined by the claims.

DETAILED DESCRIPTION

Described are embodiments of novel systems and methods for generation and use of multi-layer encoded data images. Embodiments may provide for encoding time series data into an image in a manner that provides relatively high resolution (or "detail") while maintaining image resolution. This may be useful, for example, for developing computer vision based machine learning without significant modification to existing image resolution requirements or detection techniques. In some embodiments, each of multiple time series datasets is encoded into a respective one of the layers of a multi-layer image, such as an RGB image which has a red, a green and a blue layer. For example, in the case of a RGB image having a resolution of 244 pixels×244 pixels, each of three datasets may be scaled to a resolution of 244 pixels×244 pixels and be stored in a respective one of the three layers (e.g., in the R-layer, the G-layer, or the B-layer) of the RGB image. This may enable each of the datasets to maintain a 244×244 resolution, as opposed to a 244×81 resolution that may be realized if each of the three rows were fit into an individual section (e.g., one of three rows) within the image. Although certain embodiments are described in the context of a hydrocarbon well and associated data for the purpose of illustration, the described techniques may be employed in any suitable context.

FIG. 1 is a diagram that illustrates a well environment 100 in accordance with one or more embodiments. In the illustrated embodiment, the well environment 100 includes a well system ("well") 102, a well control system ("control system") 104 and a data processing system ("processing system") 106.

The well 102 may be a hydrocarbon well (e.g., an oil well), having a wellbore 110 that extends into a hydrocarbon reservoir 112 that is defined as a portion of a subsurface formation 114 that contains a subsurface pool of hydrocarbons, such as oil and gas. In some embodiments, the well 102 includes well control devices 120. These may include devices that are operable to regulate the flow of hydrocarbons (or "production") from the well 102. The control devices 120 may include, for example, pumps (e.g., electric submersible pumps (ESPs)), valves, or the like. Operational characteristics of the well 102 may be sensed by way of well sensors 122. The well sensors 122 may include, for example, flowrate sensors, temperature sensors, pressure sensors, electrical current sensors, or the like that are operable to measure corresponding characteristics of the well 102. The well sensors 122 may, for example, include surface sensors (e.g., sensors located at wellhead) or downhole sensors (e.g., sensors located in the wellbore 110). For example, where the control devices 120 include an ESP disposed in the wellbore 110, a downhole type sensor may include, for example, a sensor located up-hole or downhole of the ESP, or an integrated sensor of the ESP.

The control system 104 may control various operations of the well 102, such as well drilling operations, well completion operations, well production operations, or well and formation monitoring operations. For example, the control system 104 may control operation of the well control devices 120 to control production flow from the well 102. In some embodiments, the control system 104 stores, or otherwise has access to, well data 130. The well data 130 may include time series data 132 that includes one or more time series datasets 134 that are indicative of various characteristics of the well 102. The time series data 132 may include, for example, time series flowrate data, time series temperature data, time series pressure data, or time series electrical current data acquired by way of respective flowrate, temperature, pressure, or electrical current sensors of the well sensors 122. For example, the time series data 132 may include first, second and third time series datasets 134a, 134b and 134c that each include 3600 data points for respective measurements of a well ESP discharge pressure, a well ESP intake pressure, and a wellhead pressure acquired about every one second over a time interval of about one hour. Although the time series datasets 134 are depicted as plots for the purpose of illustration, each of the time series datasets 134 may include a one-dimensional array of data points (e.g., $[(t_1,y_1), (t_2,y_2), (t_3,y_3) \ldots (t_{3600},y_{3600})]$), that each specify a time value (t) and a corresponding characteristic value (y). In some embodiments, the control system 104 includes a computer system that is the same as or similar to the computer system 1000 described with regard to at least FIG. 7.

The processing system 106 may provide for processing of data, such as the well data 130. In some embodiments, the processing system 106 includes a computer system that is the same as or similar to the computer system 1000 described with regard to at least FIG. 7. Although the processing system 106 is depicted at being a separate entity from the control system 104 within the environment 100 for the purpose of illustration, the processing system 106 may be integrated with the control system 104. For example, the processing system 106 may be a component of the control system 104, or the control system 104 may be a component of the processing system 106.

As described, the processing system 106 may obtain time series data and generate one or more corresponding multi-layer encoded data images. For example, the processing system 106 may obtain, from the control system 104, the time series datasets 134a, 134b and 134c, and process the time series datasets 134a, 134b and 134c to generate a corresponding multi-layer encoded data image 140. For example, in the case of the multi-layer encoded data image 140 being an RGB type image having a resolution of 244 pixels×244 pixels, each of the time series datasets 134a, 134b and 134c may be scaled to a resolution of 244 pixels×244 pixels to generate a corresponding image layer 142 (e.g., image layers 142a, 142b or 142c) that is stored in a respective one of the three layers (e.g., in the R-layer, the G-layer, or the B-layer) of the RGB type multi-layer encoded data image 140.

In some embodiments, the resulting multi-layer encoded data image 140 is used as a basis for time series analysis or forecasting. For example, a computer vision application 150 of the processing system 106 may process each layer 142 of the multi-layer encoded data image 140 to identify historical characteristics (or "past events") relating to operation of the well 102 or to predict (or "forecast") future characteristics (or "future events") relating to operation of the well 102. In some embodiments, the results of the time series analysis and forecasting is used as a basis for operating the well 102. For example, the processing system 106 may determine, based on the time series analysis and forecasting, that an ESP disposed in a wellbore 110 of the well 102 is expected to fail in the near future. In response, the data processing system 106 may determine a target flowrate to inhibit the failure of the ESP, and notify the control system 104 of the target flowrate. The well control system 104 may, in response to the notification, control the ESP (or other well devices 120) to operate at the target flowrate in an effort to avoid failure of the ESP.

Figure 2:
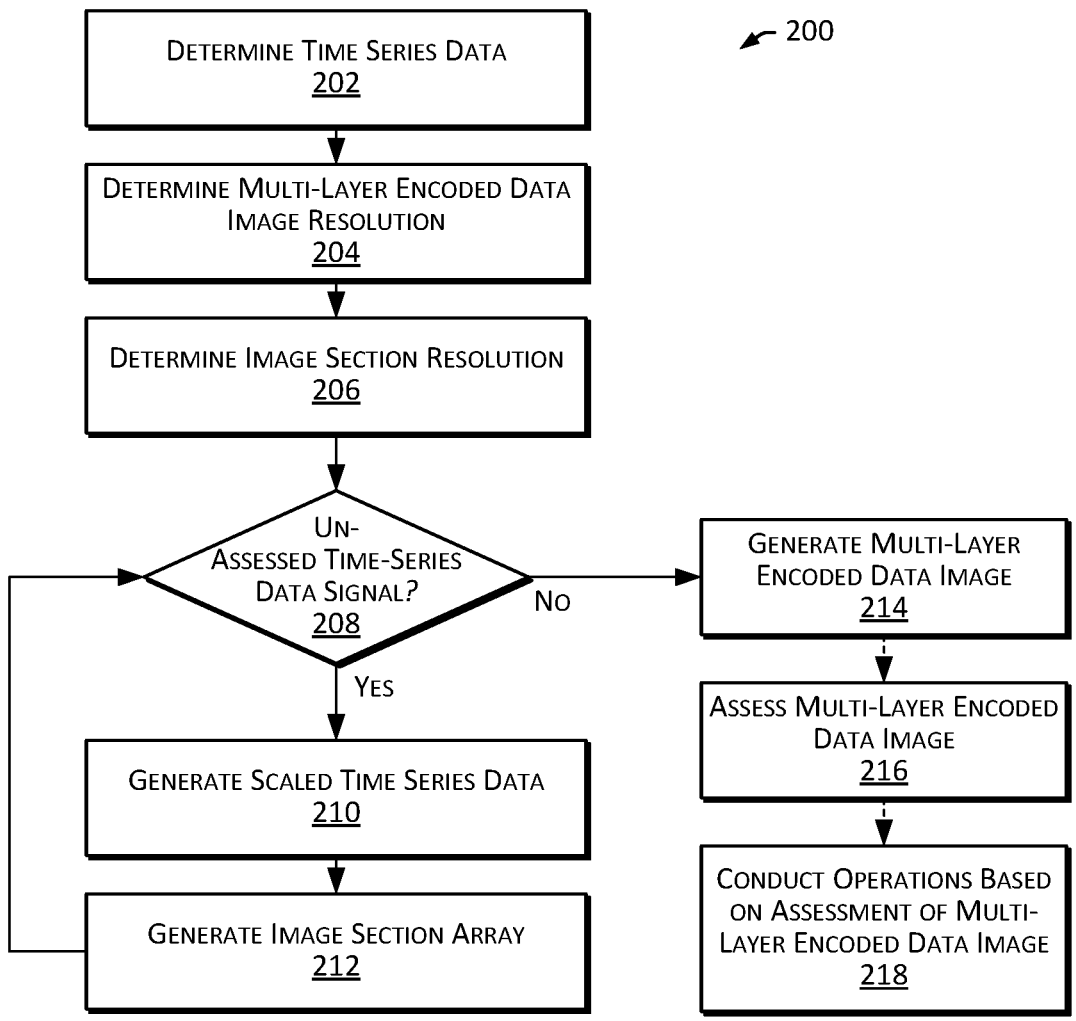
FIG. 2 is a flowchart that illustrates a method of generating and employing a multi-layer encoded data image in accordance with one or more embodiments.

FIG. 2 is a flowchart that illustrates a method 200 of generating and employing a multi-layer encoded data image in accordance with one or more embodiments. In the context of the well 102, the operations of method 200 may be performed, for example, by the control system 104, the processing system 106, or another operator of the well 102. A processing module of the processing system 106 may, for example, perform one or more of the data processing operations described, such as those directed to generating a multi-layer encoded data image 140 based on time series data 132. A well operator, such as the control system 104 or well personnel, may collect the time series data, or control operation of well devices 120 and sensors 122 of the well 102 (or other wells in the formation 114), based on results of an assessment of a multi-layer encoded data image. For example, an operator may operate the well 102 (or other wells in the reservoir 112), or otherwise develop the reservoir 112, based on the characteristics derived from time series analysis or forecasting type assessment of the multi-layer encoded data image 140.

In some embodiments, method 200 includes determining time series data (block 202). This may include, for example, obtaining multiple time series datasets that that are to be incorporated into a multi-layer encoded data image. For example, determining time series data may include the processing system 106 obtaining, from the control system 104, time series data 132 that includes multiple time series datasets.

Figure 3:
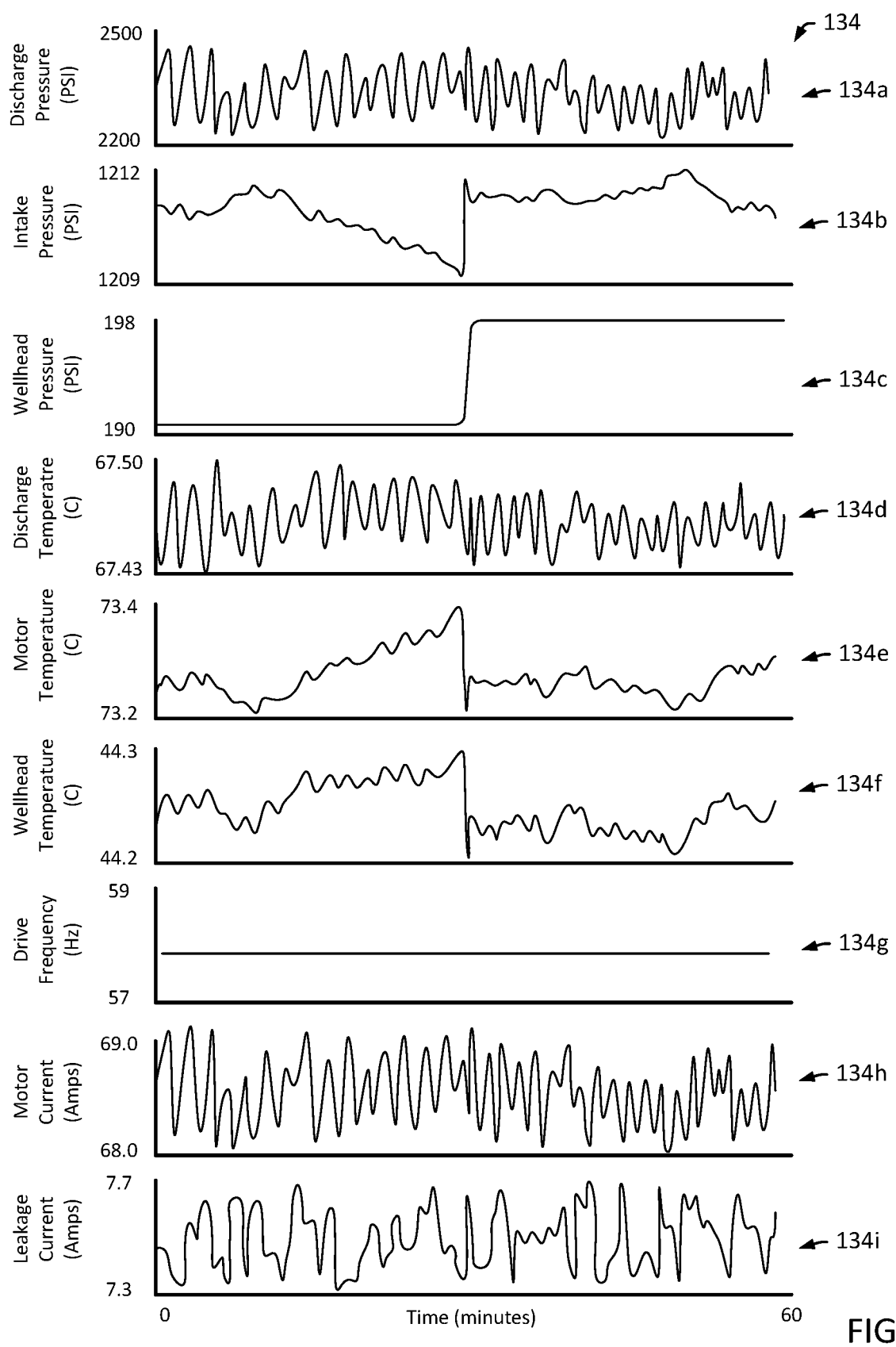
FIG. 3 is a diagram that illustrates example time series datasets in accordance with one or more embodiments.

FIG. 3 is a diagram that illustrates example time series data 132 that includes individual time series datasets 134 in accordance with one or more embodiments. In the illustrated embodiment, the time series datasets 134 include nine series datasets 134 (e.g., time series datasets 134a, 134b, 134c, 134d, 134e, 134f, 134g, 134h and 134i) that each include respective sets of data points corresponding to measurements of a well ESP discharge pressure, a well ESP intake pressure, a wellhead pressure, an ESP discharge temperature, an ESP motor temperature, a wellhead temperature, an ESP drive frequency, an ESP motor current, and an ESP leakage current, acquired from corresponding sensors 122 at regular intervals (e.g., one per second) over a time interval of about one hour. Although the time series datasets 134 are depicted as plots for the purpose of illustration, each of the time series datasets 134 may include a one-dimensional array of data points (e.g., $[(t_1,y_1), (t_2,y_2), (t_3,y_3) \ldots (t_n,y_n)]$), with each data point (e.g., $(t_n,y_n)$) specifying a time value (t) and a corresponding characteristic value (y). For example, where the first time series dataset 134a is based on pressure measurements acquired every one second of the hour, the first time series dataset 134a may include 3600 data points that are each associated with a given second within the hour and a corresponding measurement of discharge pressure for the given second (e.g., [(1 second, 2400 psi), (2 seconds, 2402 psi), (3 seconds, 2406 psi) . . . (3600 seconds, 2350 psi)]).

In some embodiments, method 200 includes determining a multi-layer encoded data image resolution (block 204). This may include determining the resolution (or "image resolution") of a multi-layer encoded data image into which the time series data is to be incorporated. For example, in the case of the multi-layer encoded data image 140 being an RGB type image having a resolution of 244 pixels×244 pixels, determining a multi-layer encoded data image resolution may include the processing system 106 determining that the multi-layer encoded data image 140 has resolution of 244 pixels×244 pixels.

In some embodiments, method 200 includes determining an image section resolution (block 206). This may include determining the resolution (or "image section resolution") of the sections into which the time series datasets are to be incorporated. In some embodiments, this may include (a) determining a section layout for the multi-layer encoded data image, and (b) determining the image section resolution based on the image resolution and the section layout.

The section layout may include a number of rows (N) of sections to be provided in each layer of the multi-layer encoded data image, and a number of columns (C) of sections to be provided in each layer of the multi-layer encoded data image. For example, if the full area of each layer 142a, 142b and 142c of the multi-layer encoded data image 140 is to be reserved for a single time series dataset (e.g., each of the layers 142a, 142b and 142c of the multi-layer encoded data image 140 is not divided into sub-sections), the number of rows (N) may be equal to one and the number of columns (C) may be equal to one (N=1, C=1).

This may provide a total of three sections within the multi-layer encoded data image 140 (e.g., one row in each of the three layers, 1×3=3). If the full area of each layer 142a, 142b and 142c of the multi-layer encoded data image 140 is to be divided into three rows, with each row reserved for a single time series dataset (e.g., each of the layers 142a, 142b and 142c of the multi-layer encoded data image 140 is divided into three rows), the number of rows (N) may be equal to three and the number of columns (C) may be equal to one (N=3, C=1). This may provide a total of nine sections within the multi-layer encoded data image 140 (e.g., three rows in each of the three layers, 3×3=9). If the full area of each layer 142a, 142b and 142c of the multi-layer encoded data image 140 is to be divided into three rows and two columns, with each resulting section reserved for a single time series dataset (e.g., each of the layers 142a, 142b and 142c of the multi-layer encoded data image 140 is divided into three rows and two columns), the number of rows (N) may be equal three and the number of columns (C) may be equal to three (N=3, C=2). This may provide a total of eighteen sections within the multi-layer encoded data image 140 (e.g., three rows and two columns to define six sections in each of the three layers, 6×3=18).

The section resolution may include a section width ($W_s$) and a section height ($H_s$). The section width ($W_s$) may correspond to the image width ($W_i$) divided by the number of columns (C). The section height ($H_s$) may correspond to the image height ($H_i$) divided by the number of rows (N). For example, continuing with an example of the multi-layer encoded data image 140 having an image resolution of 244 pixels×244 pixels, N=1 and C=1 (e.g., each layer does not include a sub-section), the section width ($W_s$) may be 244 and the section height ($H_s$) may be 244 ($W_s$=244, $H_s$=244). Continuing with an example of the multi-layer encoded data image 140 having an image resolution of 244 pixels×244 pixels, N=3 and C=1 (e.g., each layer has three row type sub-sections), the section width ($W_s$) may be 244 and the section height ($H_s$) may be 81 ($W_s$=244, $H_s$=81). Continuing with an example of the multi-layer encoded data image 140 having an image resolution of 244 pixels×244 pixels, N=3 and C=3 (e.g., each layer has three row type sub-sections), the section width ($W_s$) may be 81 and the section height ($H_s$) may be 81 ($W_s$=81, $H_s$=81).

In some embodiments, method 200 includes determining whether any time series datasets have not yet been assessed (block 208) and, if so, proceeding to generating a section image array for the unassed time series dataset. This may include generating scaled time series data for the time series dataset (block 210) and generating an image section array (block 212).

Generating scaled time series data (block 210) may include scaling the time series dataset to "fit" within the section resolution. Scaling the time series dataset to fit within the section resolution may include scaling the values of the points in time of the time series dataset across a range of zero to the section width ($W_s$) and scaling the values of the characteristic values of the time series dataset across a range of zero to the section height ($H_s$). Thus, for example, the first data point of the dataset (e.g., the data point associated with the earliest time of the time interval represented by the dataset) is set to a value of zero (e.g., x=0), the last data point of the dataset (e.g., the data point associated with the latest time of the time interval represented by the dataset) is set to a value of ($W_s$) (e.g., x=244), and the other time values (t) are scaled there between. Further, the minimum value of the characteristics of the dataset is set to a value of zero (e.g., y=0), the maximum value of the char-acteristics of the dataset is set to a value of the section height ($H_s$) (e.g., y=244), and the other characteristics values are scaled there between. This may be described as a time series dataset being "fully-scaled" to the section resolution.

Figure 4:
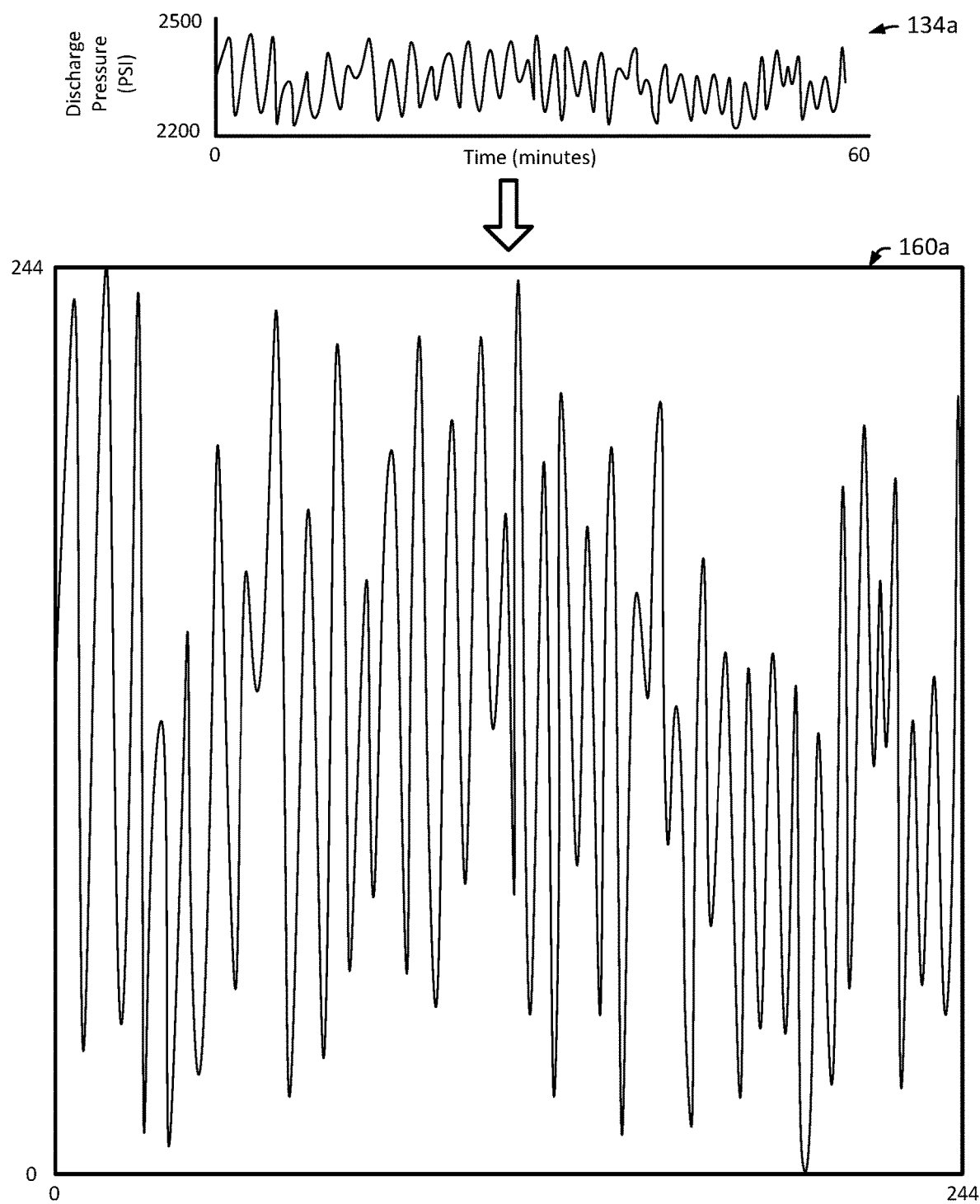
FIG. 4 is a diagram that illustrates generation of a layer of a multi-layer encoded data image in accordance with one or more embodiments.

FIG. 4 is a diagram that illustrates generation of a layer of a multi-layer encoded data image in accordance with one or more embodiments. In the illustrated embodiment, the data of the time series dataset 134a is scaled to fit within a section resolution of 244×244 to generate a fully-scaled time series dataset 160a. Such a section may, for example, be incorporated as a layer of a multi-layer encoded data image 140 having a resolution of 244 pixels×244 pixels, where N=1, and C=1 (e.g., each layer does not include a sub-section). In the illustrated embodiment, the minimum time value of about 1 second has been scaled to a value of 0, the maximum time value of about 3600 seconds has been scaled to a value of 244, the minimum characteristic value of about 2250 psi has been scaled to a value of 0, the maximum characteristic value of about 2450 psi has been scaled to a value of 244, and the other characteristic values have been scaled between 0 and 244. Thus, the time series dataset 134a may be fully-scaled to the section resolution (e.g., 244×244) for the multi-layer encoded data image 140.

Generating an image section array (block 212) may include generating a "binary" array for the corresponding section. Generation of the binary array may include (a) each of the data points in the array that corresponds to a data point of the fully scaled time series dataset being associated with a maximum (or minimum) pixel value (e.g., 255 or 0), and (b) each of the other data points in the array that corresponds to a data point of the fully scaled time series dataset being associated with a minimum (or maximum) pixel value (e.g., 0 or 255). This may effectively create a binary image array (e.g., an array having only two different pixel values) that represents the fully scaled time series dataset. For example, referring again to the example illustrated in FIG. 4, where the data points of the fully-scaled time series dataset 160a are as follows: [(0,140), (1,142), (2,143) . . . (244,150)], the image section array for the fully scaled time series dataset 160a may include the following: [(0,0,0) . . . (0,139,0), (0,140,255), (0,141,0) . . . (1,141,0), (1,142,255), (1,143,0) . . . (2,141,0), (2,142,255), (2,143,0) . . . (244,149, 0), (244,150,255), (244,151,0) . . . (244,244,0)]. Such a binary two dimensional image section array may define a two-dimensional image that depicts the fully scaled time series dataset 160a as a bright red/green/blue line/curve with a black background. The relatively high level of contrast between the curves and the background may enhance the ability of a computer vision processing application (e.g., application 150) to assess time series datasets incorporated in the multi-layer encoded data image 140. Although pixel values of 255 for data and 0 for background are described for the purpose of illustration, other embodiments may include alternative pixel values that provide sufficient contrast (e.g., pixel values of 254 for data and 1 for background, or pixel values of 0 for data and 255 for background).

Figure 5:
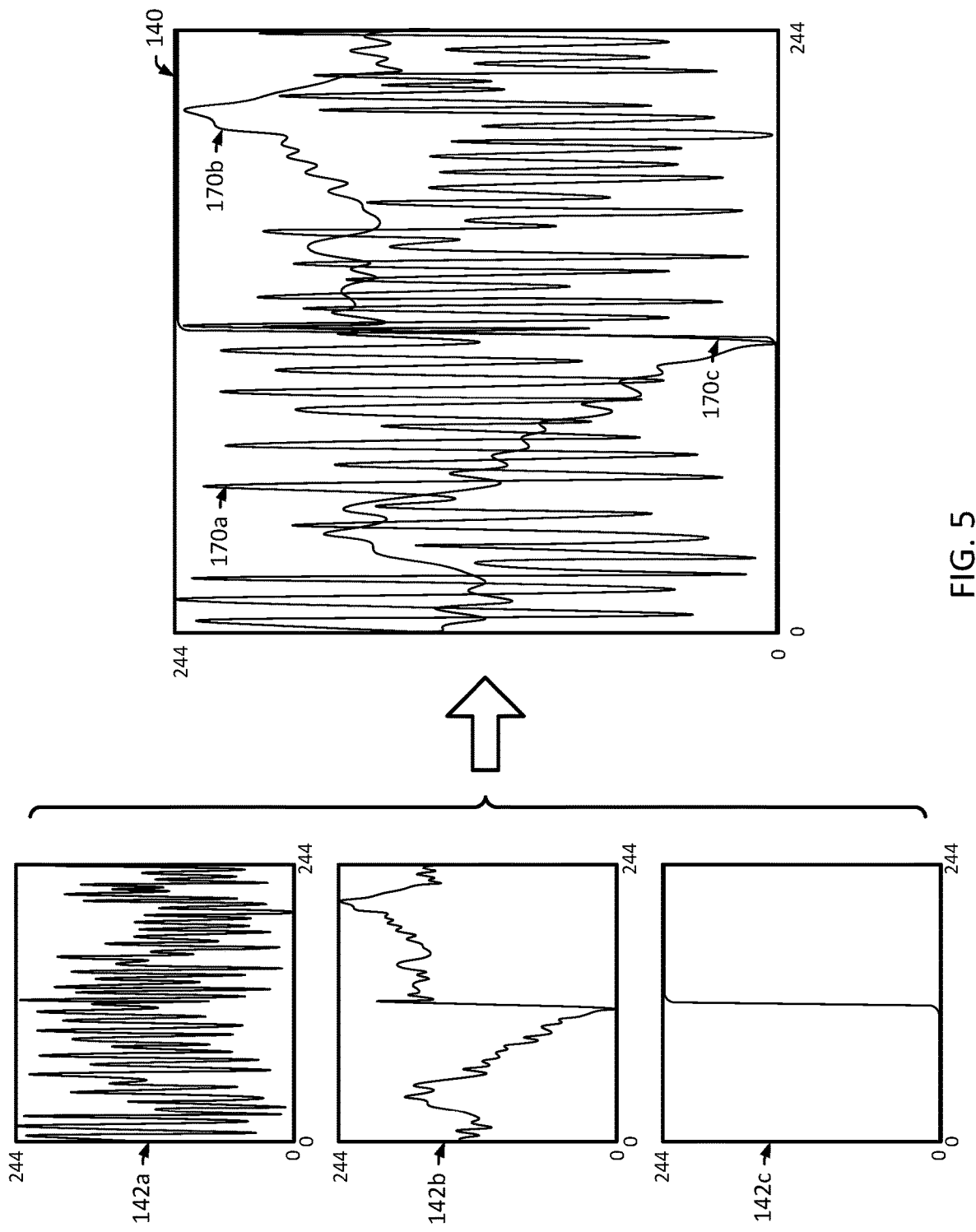
FIG. 5 is a diagram that illustrates generation of a multi-layer encoded data image in accordance with one or more embodiments.

The method 200 may iterate through generation of a section image array for each of the unassed time series datasets. In response to determining that no unassessed time series datasets remain (e.g., all of the time series datasets to be incorporated into the image have been assessed) (block 208), method 200 may proceed to generating the multi-layer encoded data image (block 214). This may include inserting the binary image arrays into a respective section of the layers of the multi-layer encoded data image, and storing the populated multi-layer encoded data image. For example, referring to FIG. 5 and continuing with the prior example of three time series datasets 134a, 134b and 134c, the multi-layer encoded data image 140 having resolution of 244 pixels×244 pixels, N=1, and C=1 (e.g., each layer does not include a sub-section), generating the multi-layer encoded data image may include the processing system 106 (a) generating a first image layer 142a that is populated with a first image section array that corresponds to the first time series dataset 134a, (b) generating a second image layer 142b that is populated with a second image section array that corresponds to the second time series dataset 134b, and (c) generating a third image layer 142c that is populated with a third image section array that corresponds to the third time series dataset 134c. The three layers that are each defined by one of the three individual two-dimensional image section arrays may be combined to generate a three-dimensional array that defines the multi-layer encoded data image 140. This may include, for example, the processing system 106 storing the first, second and third image section arrays that corresponds to the first, second, and third time series datasets 134a, 134b and 134c, respectively, as the red, green and blue layers of an RGB type the multi-layer encoded data image 140. As illustrated in the right portion of FIG. 5, a rendering of the complete multi-layer encoded data image 140 may include a simultaneous display of curves 170 representing each of the first, second, and third time series datasets 134a, 134b and 134c. The first, second and third curves 170a, 170b and 170c may be displayed in red, green and blue, respectively, with a black background. Notably, the figures include depictions of plots that include white backgrounds with dark curves (e.g., pixel values of 0 for data and 255 for background) that represent time series datasets, fully scaled time series datasets, image layers or multi-layer encoded data images, for the purpose of illustration.

Figure 6:
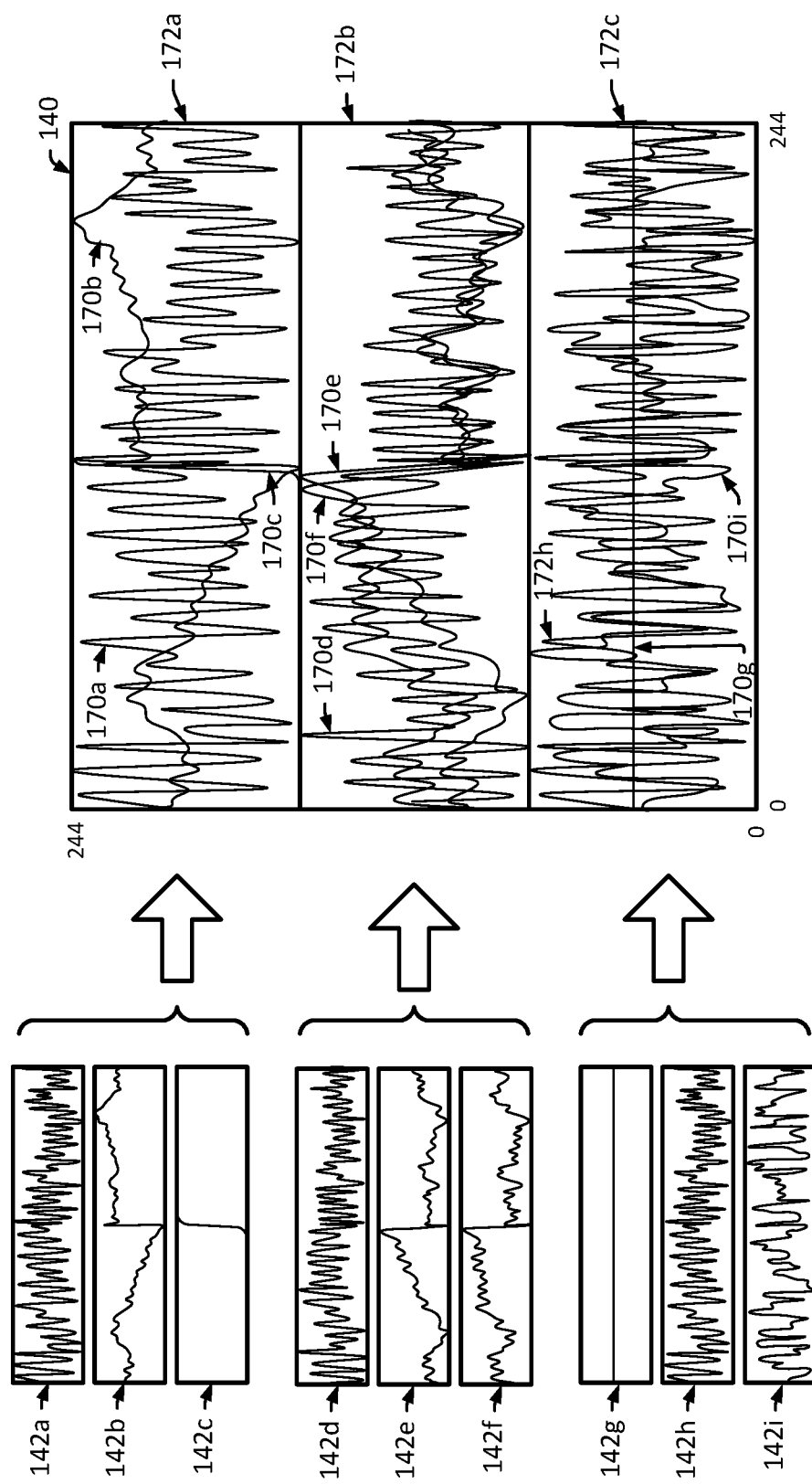
FIG. 6 is a diagram that illustrates generation of a multi-layer encoded data image in accordance with one or more embodiments.

As a further example, referring to FIG. 6 and continuing with the prior example of nine time series datasets 134a-134i, the multi-layer encoded data image 140 having resolution of 244 pixels×244 pixels, N=3, and C=1 (e.g., each layer include three row type sub-sections), generating the multi-layer encoded data image may include the processing system 106 (a) generating a first image layer 142a that is populated with first, second and third image section arrays that corresponds to the first, second and third time series datasets 134a, 134b and 134c, (b) generating a second image layer 142b that is populated with a fourth, fifth and sixth image section arrays that corresponds to the fourth, fifth and sixth time series datasets 134d, 134e and 134f, and (c) generating a third second image layer 142c that is populated with a seventh, eighth and ninth image section arrays that corresponds to the seventh, eighth and ninth time series datasets 134g, 134h and 134i. The three layers that are each defined by the three of the nine individual two-dimensional image section arrays may be combined to generate a three-dimensional array that defines the multi-layer encoded data image 140. This may include, for example, the processing system 106 storing the resulting first, second and third image layer arrays (e.g., that corresponds to respective sets of time series datasets 134), respectively, as the red, green and blue layers of an RGB type the multi-layer encoded data image 140. As illustrated in the right portion of FIG. 6, display of the complete multi-layer encoded data image 140 may include (a) in a first image row 172a of the multi-layer encoded data image 140, a simultaneous display of curves 170 (e.g., curves 170a, 170b and 170c) that represent each of the first, second, and third time series datasets 134a, 134b and 134c, (b) in a second image row 172b of the multi-layer encoded data image 140, a simultaneous display of the curves 170 (e.g., curves 170d, 170e and 170f) that represent each of the fourth, fifth and sixth time series datasets 134d, 134e and 134f, and (c) in a third image row 172c of the multi-layer encoded data image 140, a simultaneous display of the curves 170 (e.g., curves 170g, 170h and 170i) that represent each of the seventh, eighth and ninth time series datasets 134g, 134h and 134i. The curves 170a, 170b and 170c may be displayed in red, green and blue, respectively, with a black background. The curves 170d, 170e and 170f may be displayed in red, green and blue, respectively, with a black background. The curves 170g, 170h and 170i may be displayed in red, green and blue, respectively, with a black background.

In some embodiments, the method 200 includes assessing a multi-layer encoded data image (block 214). This may include conducting, using the multi-layer encoded data image that was generated, a time series analysis (e.g., analyzing the representation of the encoded time series data embedded in the multi-layer encoded data image to extract meaningful statistics and other characteristics of the data) or time series forecasting (e.g., analyzing the representation of the encoded time series data embedded in the multi-layer encoded data image to predict future values based on the encoded time series data and a corresponding model for the data). For example, in the context of the hydrocarbon well 102, the computer vision application 150 of the processing system 106 may assess the curves 170 of the multi-layer encoded data image 140 of FIG. 5 or FIG. 6 to determine operating conditions of the well 102, such as operations characteristics for one or more devices 120 the well 102. This may include, for example, assessing the using one or more of the curves of the multi-layer encoded data image 140 to determine historical or future operational characteristics of the ESP of the well 102, such as an anticipated time of failure of the ESP based on trends in the ESP's electrical current draw or other characteristics indicated by the curves of the multi-layer encoded data image 140. In some embodiments, assessment of a multi-layer encoded data image includes generating a model based on the multi-layer encoded data image. For example, the computer vision application 150 may assess the multi-layer encoded data image 140 and other the multi-layer encoded data images to extract information regarding operation of the well 102 that is used to generate a model of the well 102 that can be used as a basis for forecasting events at the well 102 (or other wells).

In some embodiments, the method 200 includes conducting operations based on a multi-layer encoded data image (block 216). This may include taking one or more actions responsive to results of time series analysis or time series forecasting of the multi-layer encoded data image. For example, in the context of the well 102, the processing system 106 may determine, based on the past or future operating conditions of the well 102 determined, a well operating parameter, relay the well operating parameter to the control system 104 (or other operator of the well 102, such as well personnel), and the control system 104 (or other operator of the well 102) may control operation of the well 102 to operate in accordance with the well operating parameter. This may include, for example, the processing system 106 determining, based on an anticipated time of failure of the ESP based on trends in the ESP's electrical current draw or other characteristics indicated by the curves of the multi-layer encoded data image 140, a reduced ESP operating speed, relay the ESP operating speed to the control system 104 (or other operator of the well 102, such as well personnel), and the control system 104 (or other operator of the well 102) may control operation of the ESP (or other devices 120) to operate to cause the ESP to operate in accordance with the ESP operating speed.

Figure 7:
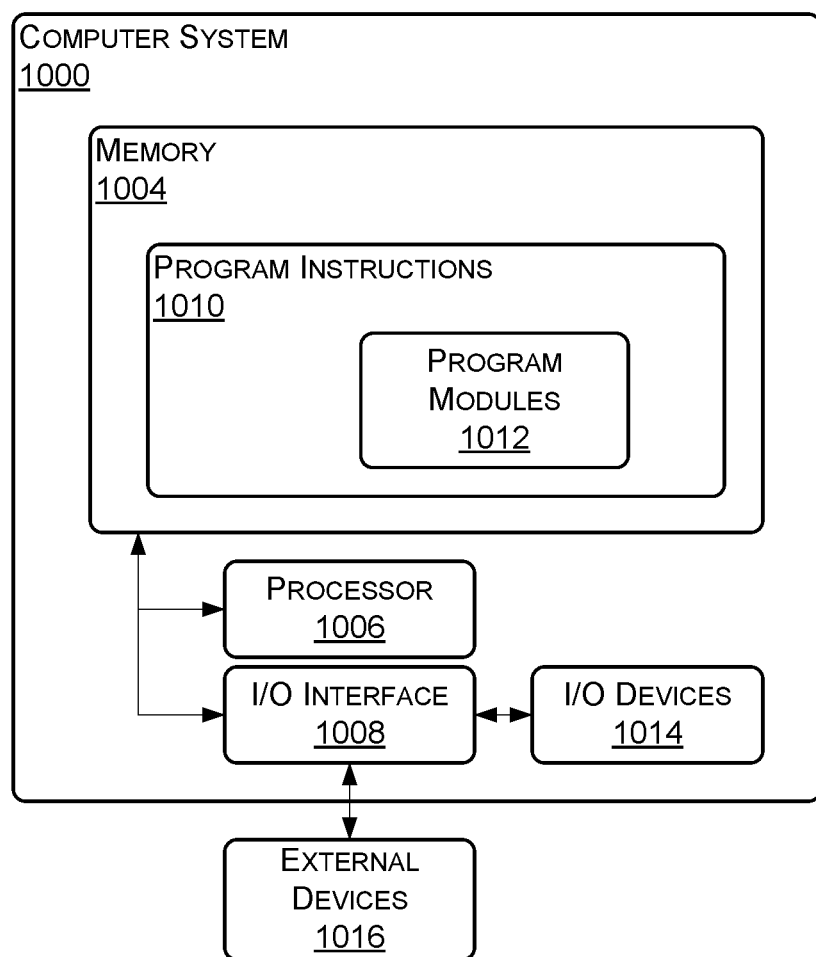
FIG. 7 is a diagram that illustrates an example computer system in accordance with one or more embodiments.

FIG. 7 is a diagram that illustrates an example computer system (or "system") 1000 in accordance with one or more embodiments. In some embodiments, the system 1000 is a programmable logic controller (PLC). The system 1000 may include a memory 1004, a processor 1006 and an input/output (I/O) interface 1008. The memory 1004 may include non-volatile memory (e.g., flash memory, read-only memory (ROM), programmable read-only memory (PROM), erasable programmable read-only memory (EPROM), electrically erasable programmable read-only memory (EEPROM)), volatile memory (e.g., random access memory (RAM), static random access memory (SRAM), synchronous dynamic RAM (SDRAM)), or bulk storage memory (e.g., CD-ROM or DVD-ROM, hard drives). The memory 1004 may include a non-transitory computer-readable storage medium having program instructions 1010 stored thereon. The program instructions 1010 may include program modules 1012 that are executable by a computer processor (e.g., the processor 1006) to cause some or all of the functional operations described here, such as those described with regard to the control system 104, the processing system 106, or method 200.

The processor 1006 may be any suitable processor capable of executing program instructions. The processor 1006 may include a central processing unit (CPU) that carries out program instructions (e.g., the program instructions of the program modules 1012) to perform the arithmetical, logical, or input/output operations described. The processor 1006 may include one or more processors. The I/O interface 1008 may provide an interface for communication with one or more I/O devices 1014, such as a joystick, a computer mouse, a keyboard, or a display screen (for example, an electronic display for displaying a graphical user interface (GUI)). The I/O devices 1014 may include one or more of the user input devices. The I/O devices 1014 may be connected to the I/O interface 1008 by way of a wired connection (e.g., an Industrial Ethernet connection) or a wireless connection (e.g., a Wi-Fi connection). The I/O interface 1008 may provide an interface for communication with one or more external devices 1016. In some embodiments, the I/O interface 1008 includes one or both of an antenna and a transceiver. In some embodiments, the external devices 1016 include well devices 120 or well sensors 122.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as examples of embodiments. Elements and materials may be substituted for those illustrated and described herein, parts and processes may be reversed or omitted, and certain features of the embodiments may be utilized independently, all as would be apparent to one skilled in the art after having the benefit of this description of the embodiments. Changes may be made in the elements described herein without departing from the spirit and scope of the embodiments as described in the following claims. Headings used herein are for organizational purposes only and are not meant to be used to limit the scope of the description.

It will be appreciated that the processes and methods described herein are example embodiments of processes and methods that may be employed in accordance with the techniques described herein. The processes and methods may be modified to facilitate variations of their implementation and use. The order of the processes and methods and the operations provided may be changed, and various elements may be added, reordered, combined, omitted, modified, and so forth. Portions of the processes and methods may be implemented in software, hardware, or a combination of software and hardware. Some or all of the portions of the processes and methods may be implemented by one or more of the processors/modules/applications described here.

As used throughout this application, the word "may" is used in a permissive sense (i.e., meaning having the potential to), rather than the mandatory sense (i.e., meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the term "or" is used in an inclusive sense, unless indicated otherwise. That is, a description of an element including A or B may refer to the element including one or both of A and B. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (e.g., by way of an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A method of operating a hydrocarbon well, the method comprising:
    obtaining a historical dataset for a hydrocarbon well, the historical dataset comprising time series datasets, each time series dataset of the time series datasets comprising, for each point in time of points in time across a time interval of the time series dataset, a characteristic value;
    determining an image resolution of a multi-layer encoded data image, the multi-layer encoded data image comprising an RGB image, and the image resolution comprising:
        an image width ($W_i$) of the multi-layer encoded data image; and an image height ($H_i$) of the multi-layer encoded data image;

determining a section layout for the multi-layer encoded data image, the section layout comprising:
- a number of rows (N) to be provided in the multi-layer encoded data image; and
- a number of columns (C) to be provided in the multi-layer encoded data image;

determining, based on the image resolution and the section layout, a section resolution, the section resolution comprising:
- a section width ($W_s$) width corresponding to the image width ($W_i$) divided by the number of columns (C); and
- a section height ($H_s$) corresponding to the image height ($H_i$) divided by the number of rows (N);

generating image section arrays for the historical dataset, the generating of the image section arrays comprising, for each time series dataset of the time series datasets:
- scaling the time series dataset to the section resolution to generate a scaled time series dataset for the time series dataset, the scaling of the time series dataset to the section resolution comprising:
  - scaling the values of the points in time of the time series dataset across a range of zero to the section width ($W_s$); and
  - scaling the values of the characteristic values of the time series dataset across a range of zero to the section height ($H_s$);
- generating an image section array for the time series dataset that comprises:
  - a first pixel value at each point in the image section array corresponding to a data point of the scaled time series dataset; and
  - a second pixel value at each point in the image section array that does not correspond to a data point of the scaled time series dataset;

generating, based on the image section arrays for the historical dataset, the multi-layer encoded data image, the multi-layer encoded data image comprising:
- a first layer defined by a first array of data that incorporates one or more of the image section arrays, the first layer being a red layer of the RGB image;
- a second layer defined by a second array of data that incorporates one or more of the image section arrays, the second layer being a green layer of the RGB image; and
- a third layer defined by a third array of data that incorporates one or more of the image section arrays, the third layer being a blue layer of the RGB image,
- wherein each image section array of the image section arrays is populated into a respective section of a respective one of the first layer, the second layer or the third layer;

assessing the multi-layer encoded data image to determine an event associated with the historical dataset;

determining, based on the event, a well operating parameter; and operating the hydrocarbon well in accordance with the well operating parameter.

2. The method of claim 1, wherein the first pixel value comprises a maximum pixel value, and wherein the second pixel value comprises a minimum pixel value.

3. The method of claim 1, wherein the first pixel value is 255, and wherein the second pixel value is 0.

4. The method of claim 1, wherein a total number of section (S) is defined by the number of rows (N) multiplied by the number of columns (C) multiplied by three, and wherein the number of rows (N) and the number of columns (C) are determined such that the total number of sections (S) is greater than or equal to a number time series datasets (D) in the historical dataset (HD).

5. The method of claim 1, wherein the assessing the multi-layer encoded data image to determine an event associated with the historical dataset comprises:
- generating a model based on the multi-layer encoded data; and
- determining the event based on the model.

6. A method of generating a multi-layer encoded data image, the method comprising:

obtaining a historical dataset comprising time series datasets, each time series dataset of the time series datasets comprising, for each point in time of points in time across a time interval of the time series dataset, a characteristic value;

determining an image resolution of a multi-layer encoded data image, the image resolution comprising:
- an image width ($W_i$) of the multi-layer encoded data image; and
- an image height ($H_i$) of the multi-layer encoded data image;

determining a section layout for the multi-layer encoded data image, the section layout comprising:
- a number of rows (N) to be provided in the multi-layer encoded data image; and
- a number of columns (C) to be provided in the multi-layer encoded data image;

determining, based on the image resolution and the section layout, a section resolution, the section resolution comprising:
- a section width ($W_s$) width corresponding to the image width ($W_i$) divided by the number of columns (C); and
- a section height ($H_s$) corresponding to the image height ($H_i$) divided by the number of rows (N);

generating image section arrays for the historical dataset, the generating of the image section arrays comprising, for each time series dataset of the time series datasets:
- scaling the time series dataset to the section resolution to generate a scaled time series dataset for the time series dataset, the scaling of the time series dataset to the section resolution comprising:
  - scaling the values of the points in time of the time series dataset across a range of zero to the section width ($W_s$); and
  - scaling the values of the characteristic values of the time series dataset across a range of zero to the section height ($H_s$);
- generating an image section array for the time series dataset that comprises:
  - a first pixel value at each point in the image section array corresponding to a data point of the scaled time series dataset; and
  - a second pixel value at each point in the image section array that does not correspond to a data point of the scaled time series dataset; and generating, based on the image section arrays for the historical dataset, the multi-layer encoded data image, the multi-layer encoded data image comprising:
- a first layer defined by a first array of data that incorporates one or more of the image section arrays;
- a second layer defined by a second array of data that incorporates one or more of the image section arrays; and a third layer defined by a third array of data that incorporates one or more of the image section arrays, wherein each image section array of the image section arrays is populated into a respective section of a respective one of the first layer, the second layer or the third layer.

7. The method of claim 6,
wherein the multi-layer encoded data image comprises a RGB image,
wherein the first layer is a red layer of the RGB image,
wherein the second layer is a green layer of the RGB image, and
wherein the third layer is a blue layer of the RGB image.

8. The method of claim 6, wherein the first pixel value comprises a maximum pixel value, and wherein the second pixel value comprises a minimum pixel value.

9. The method of claim 6, wherein the first pixel value is 255, and wherein the second pixel value is 0.

10. The method of claim 6, wherein a total number of section (S) is defined by the number of rows (N) multiplied by the number of columns (C) multiplied by three, and wherein the number of rows (N) and the number of columns (C) are determined such that the total number of sections (S) is greater than or equal to a number time series datasets (D) in the historical dataset (HD).

11. The method of claim 6, wherein the assessing the multi-layer encoded data image to determine an event associated with the historical dataset comprises:
generating a model based on the multi-layer encoded data; and
determining the event based on the model.

12. The method of claim 6, wherein the historical dataset comprises a historical dataset for a hydrocarbon well, the method further comprising:
conducting an assessment of the multi-layer encoded data image to determine an event associated with the historical dataset;
determining, based on the event, a well operating parameter; and
operating the hydrocarbon well in accordance with the well operating parameter.

13. The method of claim 12,
wherein the event comprises a condition associated with an electronic submersible pump (ESP) disposed in wellbore of the hydrocarbon well,
wherein the well operating parameter comprises a pump operating parameter for the ESP, and
wherein operating the hydrocarbon well in accordance with the well operating parameter comprises operating the ESP in accordance with the pump operating parameter.

14. A system for generating a multi-layer encoded data image, the system comprising:
a processor; and
a non-transitory computer readable storage medium comprising program instructions stored thereon that are executable by the processor to perform the following operations:
obtaining a historical dataset comprising time series datasets, each time series dataset of the time series datasets comprising, for each point in time of points in time across a time interval of the time series dataset, a characteristic value;
determining an image resolution of a multi-layer encoded data image, the image resolution comprising:
an image width ($W_i$) of the multi-layer encoded data image; and
an image height ($H_i$) of the multi-layer encoded data image;
determining a section layout for the multi-layer encoded data image, the section layout comprising:
a number of rows (N) to be provided in the multi-layer encoded data image; and
a number of columns (C) to be provided in the multi-layer encoded data image;
determining, based on the image resolution and the section layout, a section resolution, the section resolution comprising:
a section width ($W_s$) width corresponding to the image width ($W_i$) divided by the number of columns (C); and
a section height ($H_s$) corresponding to the image height ($H_i$) divided by the number of rows (N);
generating image section arrays for the historical dataset, the generating of the image section arrays comprising, for each time series dataset of the time series datasets:
scaling the time series dataset to the section resolution to generate a scaled time series dataset for the time series dataset, the scaling of the time series dataset to the section resolution comprising:
scaling the values of the points in time of the time series dataset across a range of zero to the section width ($W_s$); and
scaling the values of the characteristic values of the time series dataset across a range of zero to the section height ($H_s$);
generating an image section array for the time series dataset that comprises:
a first pixel value at each point in the image section array corresponding to a data point of the scaled time series dataset; and
a second pixel value at each point in the image section array that does not correspond to a data point of the scaled time series dataset; and
generating, based on the image section arrays for the historical dataset, the multi-layer encoded data image, the multi-layer encoded data image comprising:
a first layer defined by a first array of data that incorporates one or more of the image section arrays;
a second layer defined by a second array of data that incorporates one or more of the image section arrays; and
a third layer defined by a third array of data that incorporates one or more of the image section arrays,
wherein each image section array of the image section arrays is populated into a respective section of a respective one of the first layer, the second layer or the third layer.

15. The system of claim 14,
wherein the multi-layer encoded data image comprises a RGB image,
wherein the first layer is a red layer of the RGB image,
wherein the second layer is a green layer of the RGB image, and
wherein the third layer is a blue layer of the RGB image.

16. The system of claim 15, wherein the first pixel value comprises a maximum pixel value, and wherein the second pixel value comprises a minimum pixel value.

17. The system of claim 15, wherein the first pixel value is 255, and wherein the second pixel value is 0.

18. The system of claim 15, wherein a total number of section (S) is defined by the number of rows (N) multiplied by the number of columns (C) multiplied by three, and wherein the number of rows (N) and the number of columns (C) are determined such that the total number of sections (S) is greater than or equal to a number time series datasets (D) in the historical dataset (HD).

19. The system of claim 15, wherein the assessing the multi-layer encoded data image to determine an event associated with the historical dataset comprises:
generating a model based on the multi-layer encoded data; and
determining the event based on the model.

20. The system of claim 15, wherein the historical dataset comprises a historical dataset for a hydrocarbon well, the operations further comprising:
conducting an assessment of the multi-layer encoded data image to determine an event associated with the historical dataset;
determining, based on the event, a well operating parameter; and
operating the hydrocarbon well in accordance with the well operating parameter.

21. The system of claim 20,
wherein the event comprises a condition associated with an electronic submersible pump (ESP) disposed in wellbore of the hydrocarbon well,
wherein the well operating parameter comprises a pump operating parameter for the ESP, and
wherein operating the hydrocarbon well in accordance with the well operating parameter comprises operating the ESP in accordance with the pump operating parameter.

22. A non-transitory computer readable storage medium comprising program instructions stored thereon that are executable by a processor to perform the following operations for generating a multi-layer encoded data image:
obtaining a historical dataset comprising time series datasets, each time series dataset of the time series datasets comprising, for each point in time of points in time across a time interval of the time series dataset, a characteristic value;
determining an image resolution of a multi-layer encoded data image, the image resolution comprising:
an image width ($W_i$) of the multi-layer encoded data image; and
an image height ($H_i$) of the multi-layer encoded data image;
determining a section layout for the multi-layer encoded data image, the section layout comprising:
a number of rows (N) to be provided in the multi-layer encoded data image; and
a number of columns (C) to be provided in the multi-layer encoded data image;
determining, based on the image resolution and the section layout, a section resolution, the section resolution comprising:
a section width ($W_s$) width corresponding to the image width ($W_i$) divided by the number of columns (C); and
a section height ($H_s$) corresponding to the image height ($H_i$) divided by the number of rows (N);
generating image section arrays for the historical dataset, the generating of the image section arrays comprising, for each time series dataset of the time series datasets:
scaling the time series dataset to the section resolution to generate a scaled time series dataset for the time series dataset, the scaling of the time series dataset to the section resolution comprising:
scaling the values of the points in time of the time series dataset across a range of zero to the section width ($W_s$); and
scaling the values of the characteristic values of the time series dataset across a range of zero to the section height ($H_s$);
generating an image section array for the time series dataset that comprises:
a first pixel value at each point in the image section array corresponding to a data point of the scaled time series dataset; and
a second pixel value at each point in the image section array that does not correspond to a data point of the scaled time series dataset; and
generating, based on the image section arrays for the historical dataset, the multi-layer encoded data image, the multi-layer encoded data image comprising:
a first layer defined by a first array of data that incorporates one or more of the image section arrays;
a second layer defined by a second array of data that incorporates one or more of the image section arrays; and
a third layer defined by a third array of data that incorporates one or more of the image section arrays,
wherein each image section array of the image section arrays is populated into a respective section of a respective one of the first layer, the second layer or the third layer.

23. The medium of claim 22,
wherein the multi-layer encoded data image comprises a RGB image,
wherein the first layer is a red layer of the RGB image,
wherein the second layer is a green layer of the RGB image, and
wherein the third layer is a blue layer of the RGB image.

24. The medium of claim 22, wherein the first pixel value comprises a maximum pixel value, and wherein the second pixel value comprises a minimum pixel value.

25. The medium of claim 22, wherein the first pixel value is 255, and wherein the second pixel value is 0.

26. The medium of claim 22, wherein a total number of section (S) is defined by the number of rows (N) multiplied by the number of columns (C) multiplied by three, and wherein the number of rows (N) and the number of columns (C) are determined such that the total number of sections (S) is greater than or equal to a number time series datasets (D) in the historical dataset (HD).

27. The medium of claim 22, wherein the assessing the multi-layer encoded data image to determine an event associated with the historical dataset comprises:
generating a model based on the multi-layer encoded data; and
determining the event based on the model.

28. The medium of claim 22, wherein the historical dataset comprises a historical dataset for a hydrocarbon well, the operations further comprising:
conducting an assessment of the multi-layer encoded data image to determine an event associated with the historical dataset;
determining, based on the event, a well operating parameter; and
operating the hydrocarbon well in accordance with the well operating parameter.

29. The medium of claim 28,
wherein the event comprises a condition associated with an electronic submersible pump (ESP) disposed in wellbore of the hydrocarbon well, wherein the well operating parameter comprises a pump operating parameter for the ESP, and wherein operating the hydrocarbon well in accordance with the well operating parameter comprises operating the ESP in accordance with the pump operating parameter.

\* \* \* \* \*